(12) United States Patent
Lin et al.

(10) Patent No.: US 8,502,377 B2
(45) Date of Patent: Aug. 6, 2013

(54) PACKAGE SUBSTRATE FOR BUMP ON TRACE INTERCONNECTION

(75) Inventors: Tzu-Hung Lin, Hsinchu County (TW); Ching-Liou Huang, Hsinchu County (TW); Thomas Matthew Gregorich, San Diego, CA (US)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 70 days.

(21) Appl. No.: 13/110,935

(22) Filed: May 19, 2011

(65) Prior Publication Data

US 2012/0032343 A1    Feb. 9, 2012

Related U.S. Application Data

(60) Provisional application No. 61/371,291, filed on Aug. 6, 2010.

(51) Int. Cl.
*H01L 23/48*    (2006.01)
*H01L 23/52*    (2006.01)
*H01L 29/40*    (2006.01)
*H01L 21/44*    (2006.01)

(52) U.S. Cl.
USPC .......... 257/737; 257/773; 257/728; 257/695; 438/598; 438/599; 438/612; 438/613

(58) Field of Classification Search
USPC ........... 438/106–127, 597–688; 257/666–786
See application file for complete search history.

(56) References Cited

U.S. PATENT DOCUMENTS

| | | | |
|---|---|---|---|
| 6,025,647 A * | 2/2000 | Shenoy et al. | 257/775 |
| 2003/0214036 A1* | 11/2003 | Sarihan et al. | 257/738 |
| 2005/0035451 A1* | 2/2005 | Liu et al. | 257/738 |
| 2005/0077624 A1 | 4/2005 | Tan | |
| 2006/0079009 A1* | 4/2006 | Salmon et al. | 438/14 |
| 2009/0236756 A1* | 9/2009 | Kim et al. | 257/778 |
| 2011/0101527 A1 | 5/2011 | Cheng | |

FOREIGN PATENT DOCUMENTS

| | | |
|---|---|---|
| CN | 1501490 A | 6/2004 |
| JP | 11135532 A | 5/1999 |

* cited by examiner

*Primary Examiner* — Fernando L Toledo
*Assistant Examiner* — Karen Kusumakar
(74) *Attorney, Agent, or Firm* — Winston Hsu; Scott Margo

(57) ABSTRACT

A package substrate including a conductive pattern disposed on a die attach surface of the package substrate; at least one bumping trace inlaid into the conductive pattern; and at least one gap disposed along with the bumping trace in the conductive pattern to separate the bumping trace from a bulk portion of the conductive pattern. The bumping trace may have a lathy shape from a plan view and a width substantially between 10 μm and 40 μm and a length substantially between 70 μm and 130 μm, for example.

20 Claims, 5 Drawing Sheets

PACKAGE SUBSTRATE FOR BUMP ON TRACE INTERCONNECTION

CROSS REFERENCE TO RELATED APPLICATIONS

This application claims the benefit of U.S. provisional application No. 61/371,291 filed Aug. 6, 2010.

BACKGROUND OF THE INVENTION

1. Field of the Invention

The present invention relates to a flip chip package substrate suitable for bump on trace interconnection. The present invention is capable of providing high current density within power/ground network plane and input/output (I/O) area.

2. Description of the Prior Art

In order to ensure miniaturization and multi-functionality of electronic products or communication devices, semiconductor packages are required to be of small in size, multi-pin connection, high speed, and high functionality. Increased Input-Output (I/O) pin count combined with increased demands for high performance ICs has led to the development of flip chip packages.

Flip-chip technology uses bumps on chip to interconnect the package media such as package substrate. The flip-chip is bonded face down to the package substrate through the shortest path. These technologies can be applied not only to single-chip packaging, but also to higher or integrated levels of packaging in which the packages are larger and to more sophisticated substrates that accommodate several chips to form larger functional units. The flip-chip technique, using an area array, has the advantage of achieving the higher density of interconnection to the device and a very low inductance interconnection to the package.

FIG. 1 is a plan view showing a portion of the die attach surface of a conventional flip chip package substrate. The package substrate 20 has a die attach surface. The die attach surface at least includes a central area 201 for distributing power/ground network 200 and a peripheral area 202 encompassing the central area 201. Input/output (I/O) signal traces may be located in the peripheral area 202. The power/ground network 200 includes a comb-shaped conductive trace 210 and a comb-shaped conductive trace 220 disposed within the central area 201. For example, the comb-shaped conductive trace 210 is used to transmit power signal and the comb-shaped conductive trace 220 is used to transmit ground signal, or vice versa.

The comb-shaped conductive trace 210 is interdigitated with the comb-shaped conductive trace 220. A plurality of vias 212 for electrically connecting the comb-shaped conductive trace 210 to the underlying circuit are provided along the comb-shaped conductive trace 210. A plurality of vias 222 for electrically connecting the comb-shaped conductive trace 220 to the underlying metal circuit are provided along the comb-shaped conductive trace 220. In addition, a plurality of bumping sites (or bumping traces) 210a and a plurality of bumping sites 220a are provided along the comb-shaped conductive trace 210 and the comb-shaped conductive trace 220, respectively. These bumping sites 210a and 220a are used to interconnect with the respective bumps on a semiconductor die.

One drawback of the above-described conventional art is that the fine traces 210 and 220 cannot sustain large current density. One approach to solving this problem is to increase the widthwise dimension of the trace. However, this approach results in collapse of the bump disposed on the bumping site after reflow treatment, and thus leading to short circuit.

SUMMARY OF THE INVENTION

It is one objective to provide an improved package substrate suitable for bump on trace interconnection without the shortcomings of the prior art.

In one aspect, one embodiment of this invention provides a package substrate including a conductive pattern disposed on a die attach surface of the package substrate; at least one bumping trace inlaid into the conductive pattern; and at least one gap disposed along with the bumping trace in the conductive pattern to separate the bumping trace from a bulk portion of the conductive pattern. The bumping trace may have a lathy shape from a plan view and a width substantially between 10 μm and 40 μm and a length substantially between 70 μm and 130 μm, for example.

In another aspect, the invention provides a package substrate includes a first comb-shaped conductive pattern disposed on a die attach surface of the package substrate; a second comb-shaped conductive pattern interdigitated with the first comb-shaped conductive pattern, second comb-shaped conductive pattern being disposed on the die attach surface of the package substrate; at least one first bumping trace inlaid into the first comb-shaped conductive pattern; and at least one gap disposed along with the first bumping trace in the first comb-shaped conductive pattern to separate the first bumping trace from a bulk portion of the first comb-shaped conductive pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
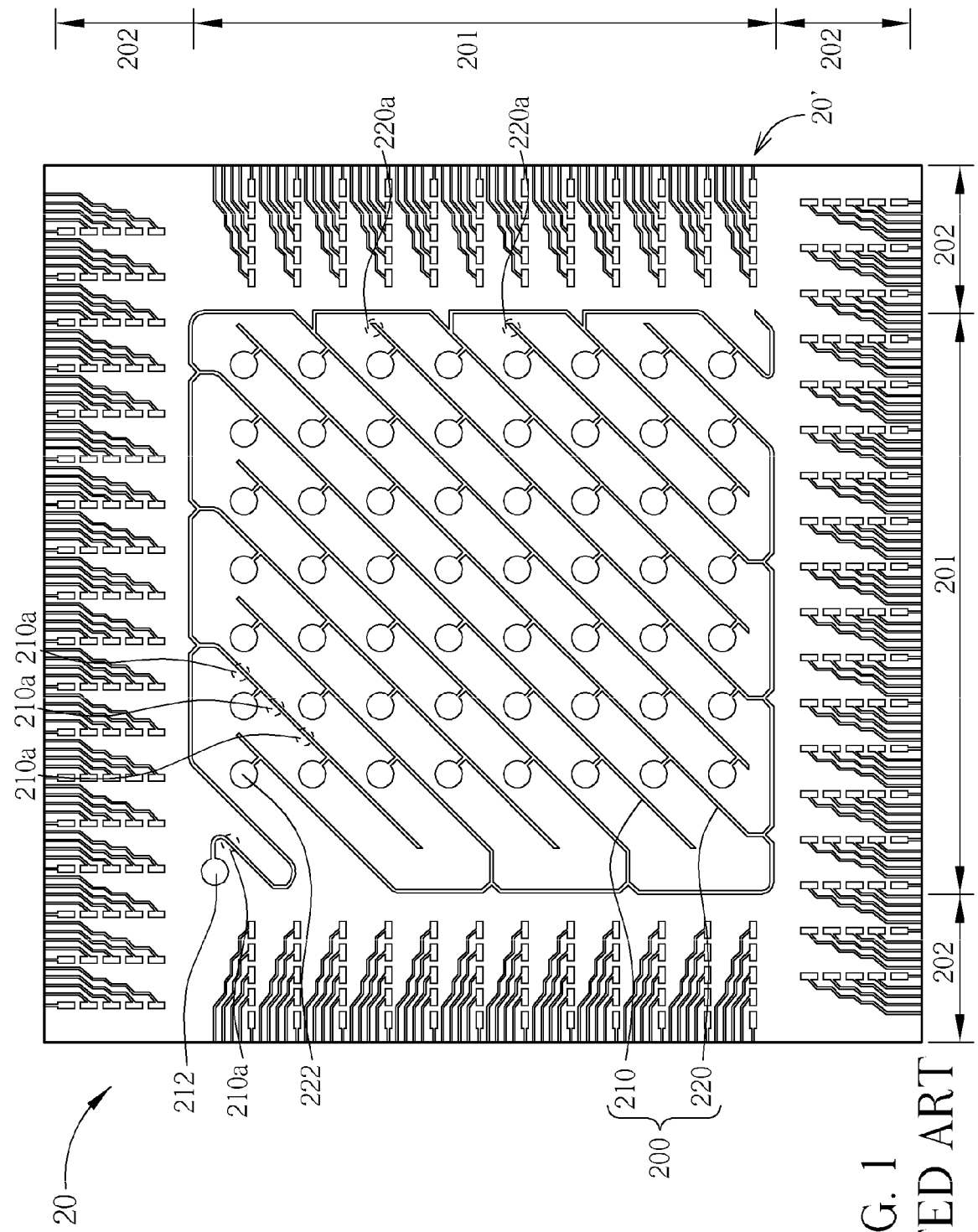
FIG. 1 is a plan view showing a portion of the die attach surface of a conventional flip chip package substrate.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Figure 2:
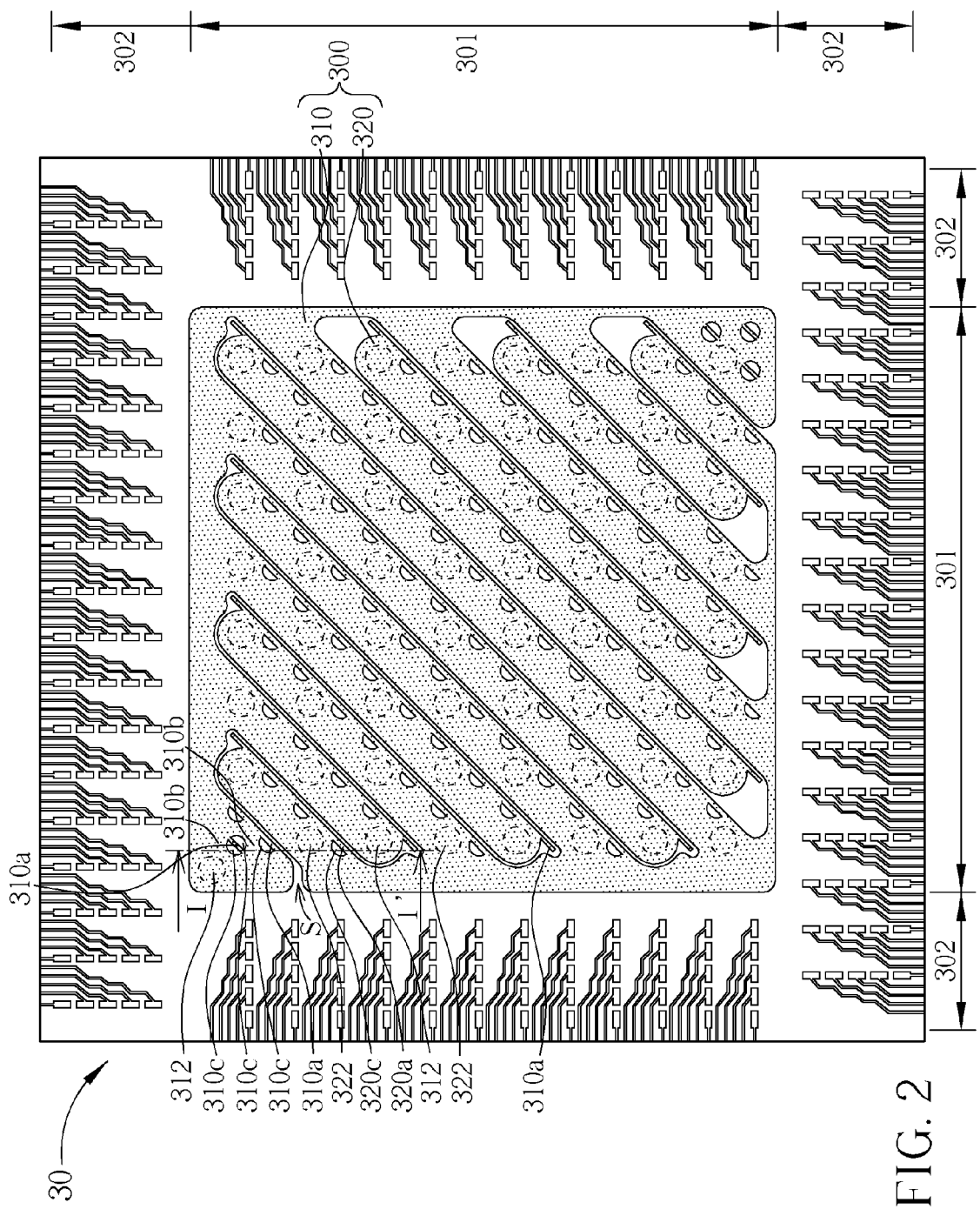
FIG. 2 is a plan view showing at least a portion of the die attach surface of a flip chip package substrate in accordance with one embodiment of this invention.
Figure 3:
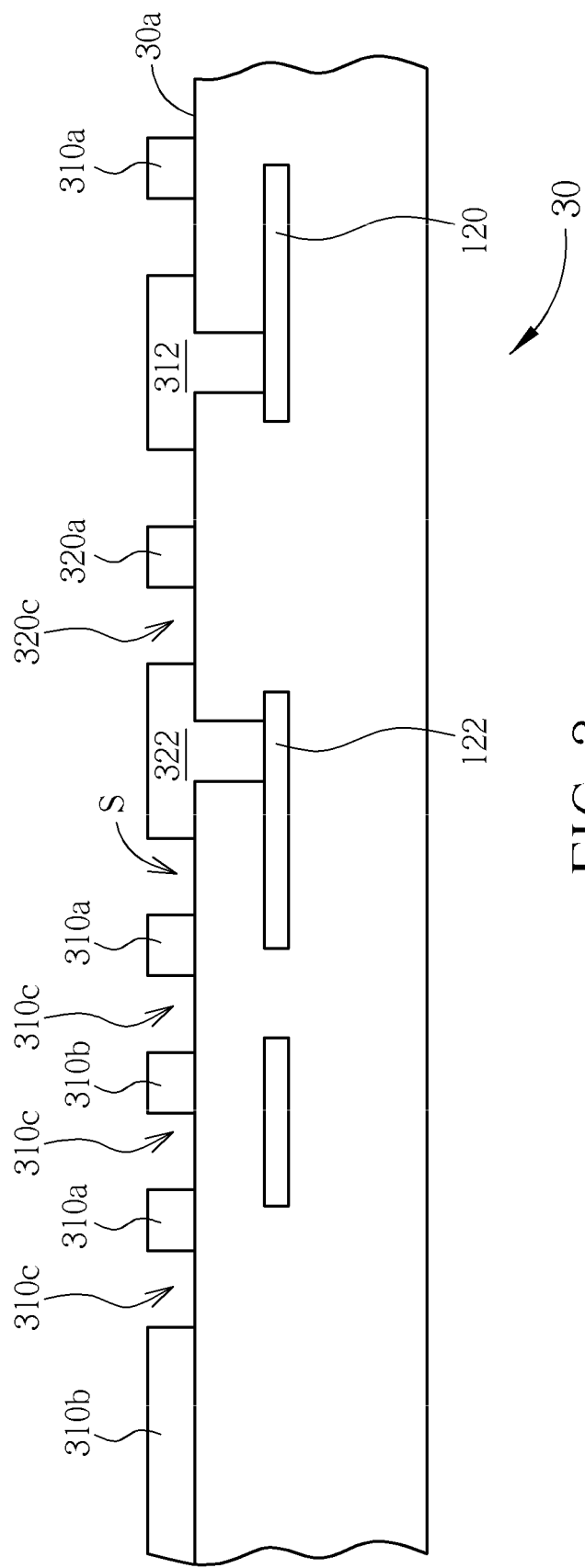
FIG. 3 is a partial sectional view taken along line I-I' in FIG. 2.

FIG. 2 is a plan view showing at least a portion of the die attach surface of a flip chip package substrate in accordance with one embodiment of this invention. FIG. 3 is a partial sectional view taken along line I-I' in FIG. 2. As shown in FIG. 2 and FIG. 3, the package substrate 30 has a die attach surface 30a. The die attach surface 30a includes a central area 301 for distributing power/ground network 300 and a peripheral area 302 encompassing the central area 301. According to the embodiment of this invention, the power/ground network 300 comprises a widened, comb-shaped conductive pattern 310 and a widened, comb-shaped conductive pattern 320 disposed within the central area 301. The conductive patterns 310 and 320 herein can be made of metal or any other conductive material. Though the conductive patterns 310 and 320 are comb-shaped in this embodiment, they can be of any other shape according to different design requirements.

In this embodiment, the widened, comb-shaped conductive pattern 310 is used to distribute ground voltage and the widened, comb-shaped conductive pattern 320 is used to distribute power voltage, or vice versa. The widened, comb-shaped conductive pattern 310 and the widened, comb-shaped conductive pattern 320 overcome the bottleneck of current density limit and are capable of providing higher current density within power/ground network plane, input/output (I/O) area or any other area needs higher current density.

According to the embodiment of this invention, the widened, comb-shaped conductive pattern 310 is interdigitated with the widened, comb-shaped conductive pattern 320 with a gap S therebetween. As shown in FIG. 3, at least one via 312 for electrically connecting the widened, comb-shaped conductive pattern 310 to the underlying conductive layer 120 is provided. At least one via 322 for electrically connecting the widened, comb-shaped conductive pattern 320 to the underlying conductive layer 122 is provided. As can be seen in FIG. 2, the vias 312 can be covered by and/or completely overlap with the widened, comb-shaped conductive pattern 310. The vias 322 can be covered by and/or completely overlap with the widened, comb-shaped conductive pattern 320.

A plurality of bumping traces or bumping sites 310a and a plurality of bumping traces or bumping sites 320a are provided in the widened, comb-shaped conductive pattern 310 and the widened, comb-shaped conductive pattern 320, respectively. These bumping sites 310a and 320a are used to interconnect with the respective bumps such as copper pillar bumps on a semiconductor die. For example, for 45 μm×90 μm copper pillar bumps on a semiconductor die, each of the bumping sites 310a and the bumping sites 320a may have a lathy shape from a plan view with a dimension of about 25 μm×110 μm. According to the embodiment of this invention, each of the bumping traces or bumping sites 310a and 320a may have a width substantially between 10 μm and 40 μm and a length substantially between 70 μm and 130 μm. More specifically, the bumping sites 310a and the bumping sites 320a may be inlaid into the widened, comb-shaped conductive pattern 310 and the widened, comb-shaped conductive pattern 320, respectively. For example, some of the bumping sites 310a and 320a may be disposed along an edge of the widened, comb-shaped conductive patterns 310 and 320, respectively. Some of the bumping sites 310a and 320a may protrude from one distal end of the widened, comb-shaped conductive patterns 310 and 320 respectively and are therefore not encompassed by the widened, comb-shaped conductive patterns 310 and 320. Some of the bumping sites 310a and 320a may be farther away from the edge of the widened, comb-shaped conductive patterns 310 and 320, respectively, and may be surrounded by conductive lumps 310b. The conductive lumps 310b herein can be made of metal or any other conductive material.

Figure 4A:
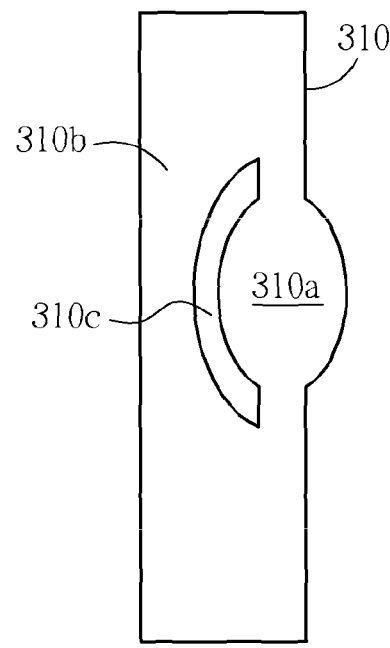
FIGS. 4A and 4B are enlarged top views showing the exemplary scheme of the bumping sites in the widened, comb-shaped conductive pattern.
Figure 4B:
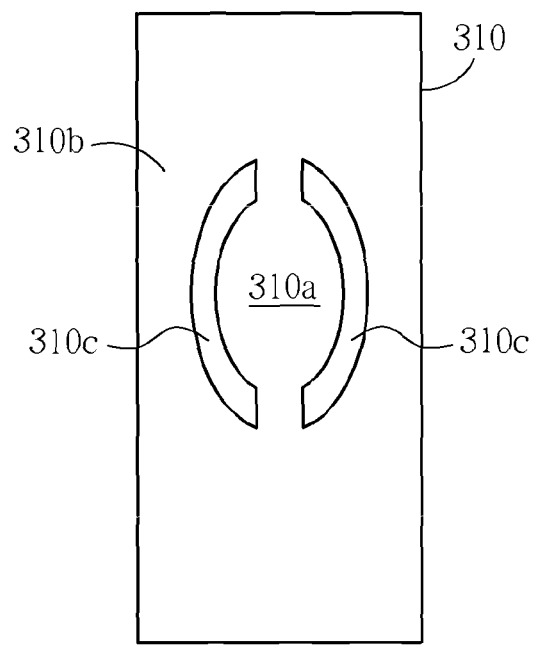

FIGS. 4A and 4B are schematic, enlarged top views showing the exemplary schemes of the bumping sites in the widened, comb-shaped conductive pattern. By way of example, as shown in FIG. 4A, for those bumping traces or bumping sites 310a that are disposed along an edge of the widened, comb-shaped conductive pattern 310, a single-sided gap 310c can be disposed along with at least one of the bumping traces or bumping sites 310a to separate the at least one bumping traces or bumping sites 310a from a bulk portion of the widened, comb-shaped conductive pattern 310. As shown in FIG. 4B, for those bumping traces or bumping sites 310a that are farther away from the edge of the widened, comb-shaped conductive pattern 310, double gaps 310c can be provided on opposite sides of the lathy, shaped bumping sites 310a. Accordingly, depending on the positions of the bumping sites or traces or other design requirements, the shapes of the bumping sites or traces may be different. The gaps 310c are provided to prevent reliability issues from occurring during flip chip assembly process. Similarly, gaps 320c may be provided in the widened, comb-shaped conductive pattern 320 in order to define the shape of the bumping sites 320a and to separate the bumping sites or traces 320a from a bulk portion of the conductive pattern 320. The gaps 310c and 320c may be of any suitable shapes, for example, half-moon shape, rectangular shape, polygon shape or irregular shape. Further, the shapes of the gaps 310c and 320c and the shapes of the bumping sites or traces 310a and 320a may change according to the bump shapes on the chip or other design requirements.

Figure 5:
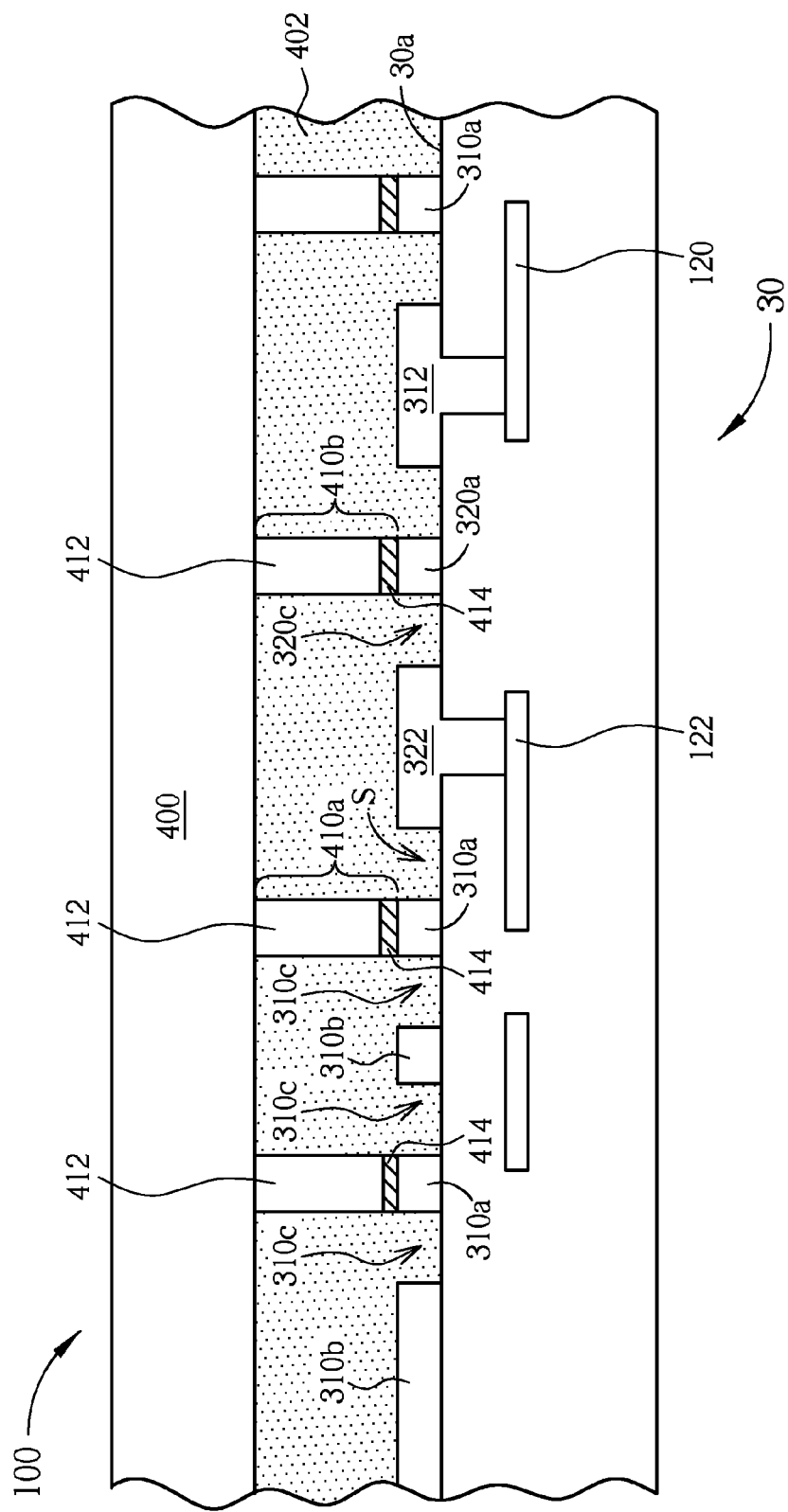
FIG. 5 illustrates a sectional view of the package substrate after mounting thereon a semiconductor die in accordance with one embodiment of the invention.

FIG. 5 illustrates a sectional view of the package substrate 100 after mounting thereon a semiconductor die 400 in accordance with one embodiment of the invention. As shown in FIG. 5, a semiconductor die or die 400 is mounted on the die attach surface 30a of the package substrate 30 with the active surface of the die 400 facing the package substrate 30. The circuitry of the die 400 can be interconnected to the circuitry of the package substrate 30 via a novel bump on trace interconnection scheme. For example, the die 400 may employ the bump on trace interconnection scheme including lathy copper pillar bumps 410a and 410b disposed on the active surface of the die 400 corresponding to the bumping sites or traces 310a and 320a on the package substrate 30.

At least one of the copper pillar bumps 410a and 410b may be composed of a metal stack comprising an UBM (under bump metallurgy) layer such as a sputtered UBM layer (not explicitly shown), a copper layer 412 such as a plated copper layer, and a solder cap 414. In this embodiment, the copper pillar bumps 410a and 410b can be oval-shaped from a plan view. According to the embodiment, at least one of the copper pillar bumps 410a and 410b, when viewed from above, may have a rounded and slightly elongated outline. It is advantageous to use the present invention because the gaps 310c and 320c disposed along with at least one of the bumping sites or traces 310a and 320a can alleviate or prevent bump collapse and short circuit. The copper pillar bumps can further relieve or avoid the prior art problem of short circuit due to reflow treatment.

During the flip chip assembly, the two copper pillar bumps 410a and 410b, for example, are bonded onto the bumping sites or traces 310a and 320a, respectively. Due to the small size of the copper pillar bumps 410a and 410b, the stress in the package is reduced, the bump-to-trace space is increased and the problem of bump-to-trace bridging can be effectively avoided. After the reflowing process, an underfill material or underfill 402 can be introduced into the gap between the die 400 and the package substrate 30 with an increased stand-off height. The increased stand-off height facilitates the underfill process. According to the embodiment, the underfill 402 may be capillary underfill (CUF), molded underfill (MUF) or a combination thereof.

In addition, according to the embodiment of this invention, at least the central area 301 in FIG. 2 is not covered with a solder mask (not shown). In another embodiment, both of the central area 301 and the peripheral area 302 in FIG. 2 are not covered with the solder mask. This is because the gaps 310c and 320c disposed along with at least one of the bumping sites or traces 310a and 320a can prevent or alleviate bump collapse and short circuit. The copper pillar bumps can further relieve or avoid the prior art problem of short circuit due to reflow treatment. Since the power/ground network 300 comprises widened conductive patterns 310 and 320, a higher current density can be sustained. It is to be understood that applying the present invention to the power/ground network 300 as depicted in FIG. 2 is for illustration purposes only. The present invention may be applicable to signal trace for high power consumption or any signal trace for carrying large current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package substrate, comprising:
   a conductive pattern disposed on a die attach surface of the package substrate;
   at least one bumping trace inlaid into the conductive pattern; and
   at least one gap disposed along with the bumping trace in the conductive pattern to separate the bumping trace from a bulk portion of the conductive pattern.

2. The package substrate according to claim 1 wherein the bumping trace has a lathy shape from a plan view.

3. The package substrate according to claim 2 wherein the bumping trace has a width substantially between 10 μm and 40 μm and a length substantially between 70 μm and 130 μm.

4. The package substrate according to claim 1 wherein the at least one gap is provided in the conductive pattern between an edge of the bumping trace and the conductive pattern.

5. The package substrate according to claim 1 wherein the conductive pattern is a comb-shaped conductive pattern.

6. The package substrate according to claim 1 wherein the die attach surface includes a central area for distributing power/ground network and a peripheral area encompassing the central area.

7. The package substrate according to claim 6 wherein the conductive pattern and the bumping trace are disposed within the central area.

8. The package substrate according to claim 6 wherein at least the central area is not covered by a solder mask.

9. The package substrate according to claim 8 wherein both of the central area and the peripheral area are not covered by the solder mask.

10. The package substrate according to claim 1 further comprising at least one via for electrically connecting the conductive pattern to an underlying conductive layer.

11. A package substrate, comprising:
    a first comb-shaped conductive pattern disposed on a die attach surface of the package substrate;
    a second comb-shaped conductive pattern disposed on the die attach surface of the package substrate and interdigitated with the first comb-shaped conductive pattern;
    at least one first bumping trace inlaid into the first comb-shaped conductive pattern; and
    at least one gap disposed along with the first bumping trace in the first comb-shaped conductive pattern to separate the first bumping trace from a bulk portion of the first comb-shaped conductive pattern.

12. The package substrate according to claim 11 wherein the first bumping trace has a lathy shape from a plan view.

13. The package substrate according to claim 12 wherein the first bumping trace has a width substantially between 10 μm and 40 μm and a length substantially between 70 μm and 130 μm.

14. The package substrate according to claim 11 wherein the at least one first gap is provided in the first comb-shaped conductive pattern between an edge of the first bumping trace and the first comb-shaped conductive pattern.

15. The package substrate according to claim 11 further comprising a second bumping trace inlaid into the second comb-shaped conductive pattern, wherein at least one second gap is provided in the second comb-shaped conductive pattern between an edge of the second bumping trace and the second comb-shaped conductive pattern.

16. The package substrate according to claim 11 wherein the die attach surface includes a central area for distributing power/ground network and a peripheral area encompassing the central area.

17. The package substrate according to claim 16 wherein the first and second comb-shaped conductive patterns are disposed within the central area.

18. The package substrate according to claim 16 wherein at least the central area is not covered by a solder mask.

19. The package substrate according to claim 18 wherein both of the central area and the peripheral area are not covered by the solder mask.

20. The package substrate according to claim 11 further comprising at least one first via and at least one second via respectively for electrically connecting the first and second comb-shaped conductive patterns to an underlying conductive layer.

* * * * *